US012216495B2

(12) United States Patent
Hong et al.

(10) Patent No.: US 12,216,495 B2
(45) Date of Patent: Feb. 4, 2025

(54) CUSTOMIZED STRETCHABLE WEARABLE DEVICE AND MANUFACTURING METHOD THEREFOR

(71) Applicant: Seoul National University R&DB Foundation, Seoul (KR)

(72) Inventors: Yongtaek Hong, Seoul (KR); Jaeyoung Yoon, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 472 days.

(21) Appl. No.: 17/287,109

(22) PCT Filed: Oct. 23, 2019

(86) PCT No.: PCT/KR2019/013934
§ 371 (c)(1),
(2) Date: Apr. 20, 2021

(87) PCT Pub. No.: WO2020/096229
PCT Pub. Date: May 14, 2020

(65) Prior Publication Data
US 2021/0356988 A1 Nov. 18, 2021

(30) Foreign Application Priority Data
Nov. 5, 2018 (KR) .................. 10-2018-0134464

(51) Int. Cl.
*G06F 1/16* (2006.01)
*H05K 1/18* (2006.01)

(52) U.S. Cl.
CPC ............ *G06F 1/163* (2013.01); *G06F 1/1652* (2013.01); *H05K 1/181* (2013.01)

(58) Field of Classification Search
CPC ........ G06F 1/163; G06F 1/1652; G06F 3/014; H05K 1/181
See application file for complete search history.

(56) References Cited

U.S. PATENT DOCUMENTS

2008/0081963 A1\* 4/2008 Naghavi .................. A61B 5/01
600/301
2016/0127448 A1 5/2016 Park et al.
(Continued)

FOREIGN PATENT DOCUMENTS

JP 2017-139413 A 8/2017
KR 10-1560585 B1 10/2015
(Continued)

OTHER PUBLICATIONS

International Search Report mailed Jan. 31, 2020 for International Application No. PCT/KR2019/013934 and its English translation.
(Continued)

*Primary Examiner* — Towfiq Elahi
(74) *Attorney, Agent, or Firm* — Insight Law Group, PLLC; Seung Lee (57) ABSTRACT

The present invention relates to a customized stretchable wearable device and a manufacturing method therefor, enabling the manufacturing of a customized stretchable wearable device which fits the body characteristics of a wearing subject who is wearing the wearable device, thereby enabling good wear comfort and sense of operation, and also a beautiful exterior.

8 Claims, 10 Drawing Sheets

(56) References Cited

U.S. PATENT DOCUMENTS

2016/0282899 A1* 9/2016 Inagaki ................ A44C 5/0053
2016/0335871 A1* 11/2016 Kim ................... G08B 21/0288
2017/0181275 A1* 6/2017 Dias ........................ H05K 3/32
2017/0344055 A1* 11/2017 Aleksov .............. H01L 23/5387

FOREIGN PATENT DOCUMENTS

| KR | 10-2016-0053625 A1 | 5/2016 |
| KR | 10-2016-0132689 A | 11/2016 |
| KR | 10-1765266 B | 8/2017 |

OTHER PUBLICATIONS

Dong Hae Ho et al., "Recent Research Trend in Flexible and Stretchable Electrode for Wearable Device", KIC News, vol. 21, No. 1, 2018 and its English abstract.

* cited by examiner

ASSEMBLED WEARABLE DEVICE

REARRANGING AND REASSEMBLING

FIG. 5

CUSTOMIZED STRETCHABLE WEARABLE DEVICE AND MANUFACTURING METHOD THEREFOR

CROSS-REFERENCE TO RELATED APPLICATION(S)

This application is a national stage entry of International Application No. PCT/KR2019/013934, filed on Oct. 23, 2019, which claims priority from Korean Patent Application No. 10-2018-0134464, filed on Nov. 5, 2018, in the Korean Intellectual Property Office, the disclosures of which are incorporated herein by reference in their entirety.

TECHNICAL FIELD

The present invention relates to a wearable device which is wearable on human skin and the like, and more particularly, to a customized stretchable wearable device and a method of manufacturing the same.

BACKGROUND ART

Electronic elements, circuits, and the like forming hard wearable electronic devises are mainly formed of materials with high Young's moduli. For this reason, the electronic elements, circuits, and the like are easily broken when deformed by external force. Accordingly, studies on flexible wearable devices which maintain their original functions while being transformed to correspond to external deformation are being conducted recently.

However, in the conventional technology of manufacturing a wearable device by assembling modularized flexible electronic blocks, since the flexible electronic blocks are assembled to have a predetermined size, a predetermined arrangement position, and a predetermined arrangement shape, customized wearable devices corresponding to body characteristics of wearing subjects who are wearing the wearable devices may not be provided.

In Korean Patent Publication No. 10-2016-0053625 (May 13, 2016), a user customized wearable device is proposed. However, the device according to this technology is not a customized wearable device corresponding to body characteristics of a wearer but is a functionally customized wearable device having a difference for each user by adding or removing function blocks required for each user.

Accordingly, the present inventor has conducted a study of a customized wearable device which is not a functionally customized wearable device having a difference in function required for each user but is manufacturable to correspond to body characteristics of a wearing subject wearing the wearable device.

DISCLOSURE

Technical Problem

The present invention is directed to providing a customized stretchable wearable device manufacturable to correspond to body characteristics of a wearing subject wearing the wearable device and a method of manufacturing the same.

Technical Solution

According to an aspect of the present invention, a customized stretchable wearable device includes a stretchable wearable substrate which is worn on an irregularly curved surface, and a plurality of modularized flexible electronic blocks which are attached to the stretchable wearable substrate in a chemical or physical coupling manner, and of which sizes, arrangement shapes, and arrangement positions are adjusted to correspond to a characteristic of the irregularly curved surface on which the stretchable wearable substrate is worn.

According to an additional aspect of the present invention, the customized stretchable wearable device may further include a buffer layer chemically or physically coupled between the stretchable wearable substrate and each of the modularized flexible electronic blocks so as to prevent delamination of the modularized flexible electronic blocks coupled to the stretchable wearable substrate.

According to an additional aspect of the present invention, the modularized flexible electronic blocks may include a circuit block in which circuits including an integrated circuit (IC) chip are modularized, a sensor block in which a sensor is modularized, and a stretchable electrode block for electrically connecting the circuit block and the sensor block.

According to an additional aspect of the present invention, the size or shape of the modularized flexible electronic block may be adjusted by cutting a part of the modularized flexible electronic block.

According to an additional aspect of the present invention, the modularized flexible electronic block may be chemically coupled to the stretchable wearable substrate through covalent bonding.

According to an additional aspect of the present invention, the modularized flexible electronic block may be physically coupled to the stretchable wearable substrate using a flexible bonding material.

According to an additional aspect of the present invention, the irregularly curved surface may be skin of a wearing subject.

According to an additional aspect of the present invention, the stretchable wearable substrate may be a transparent stretchable glove which is worn on the skin of the wearing subject.

According to another aspect of the present invention, a method of manufacturing a customized stretchable wearable device, includes a circuit block manufacturing operation of manufacturing a circuit block by chemically surface-treating a substrate film, printing an electrode on the chemically surface-treated film, and coupling an IC chip, a sensor block manufacturing operation of manufacturing a sensor block by chemically surface-treating a substrate film, printing an electrode on the chemically surface-treated film, and coupling a sensor, a stretchable electrode block manufacturing operation of manufacturing a stretchable electrode block into which a stretchable electrode is inserted by applying and curing a polymer compound having stretchability onto a substrate coated with a stretchable electrode material, a substrate surface activating operation of activating a surface of a stretchable wearable substrate by performing an oxygen plasma treatment on one surface of the stretchable wearable substrate, a substrate wearing operation of wearing the one surface, on which the surface is activated, of the stretchable wearable substrate on an irregularly curved surface, a circuit block and sensor block attaching operation of arranging at least one circuit block and at least one sensor block each of which a size, an arrangement shape, and an arrangement position are adjusted to correspond to a characteristic of the irregularly curved surface on the other surface of the stretchable wearable substrate and attaching the at least one circuit block and the at least one sensor block to the stretchable wearable substrate in a chemical or physical coupling manner, and a stretchable electrode block attaching operation of attaching the stretchable electrode block of which a size is adjusted to correspond to the characteristic of the irregularly curved surface between the circuit block and the sensor block which are attached to the other surface of the stretchable wearable substrate.

According to an additional aspect of the present invention, in the circuit block manufacturing operation, the sensor block manufacturing operation, or the stretchable electrode block manufacturing operation, a buffer layer for preventing delamination of the circuit block, the sensor block, or the stretchable electrode block attached to the stretchable wearable substrate may be formed on an attachment surface of the substrate of the circuit block, the sensor block, or the stretchable electrode block.

Advantageous Effects

According to the present invention, since a customized stretchable wearable device corresponding to body characteristics of a wearing subject wearing the wearable device can be manufactured, there are effects in that wearing and operating sensations are good and the exterior is beautiful.

MODES OF THE INVENTION

Hereinafter, in order to facilitate understanding and embodiment by those skilled in the art, the present invention will be described in detail by explaining exemplary embodiments with reference to the accompanying drawings. Although specific embodiments are illustrated in the drawings and detailed explanations are described, the embodiments are not intended to limit embodiments of the present invention in the specific shapes.

In the description of the invention, when it is determined that detailed descriptions of related well-known functions unnecessarily obscure the gist of the invention, the detailed descriptions thereof will be omitted.

It will be understood that when an element is referred to as being "connected" or "coupled" to another element, it can be directly connected or coupled to another element or intervening elements may be present.

In contrast, will be understood that when an element is referred to as being "directly connected" or "directly coupled" to another element, there are no intervening elements.

Figure 1A:
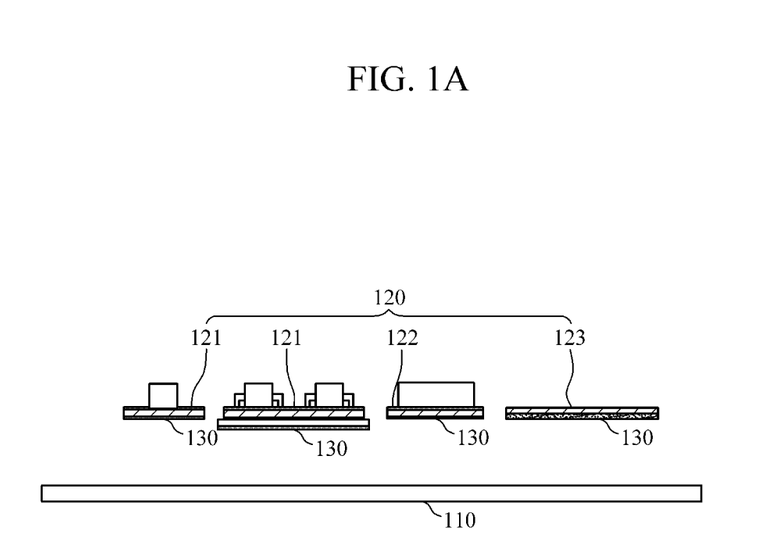
FIGS. 1A, 1B and 1C are a set of views illustrating a configuration of one embodiment of a customized stretchable wearable device according to the present invention.
Figure 1B:
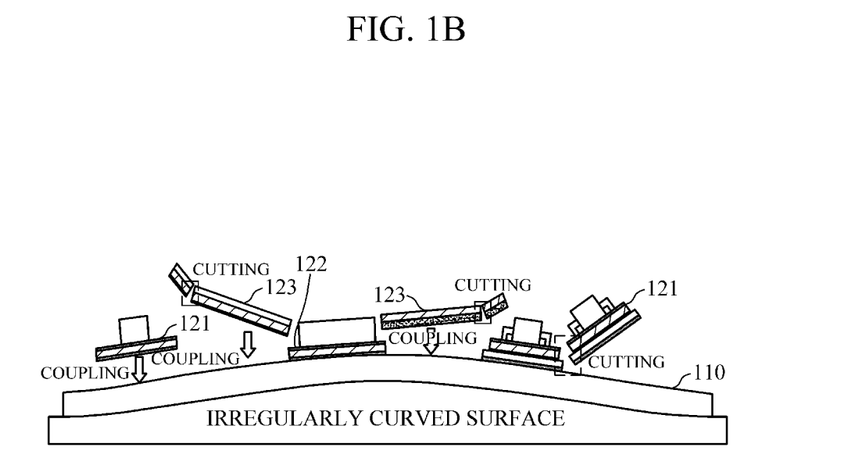
Figure 1C:
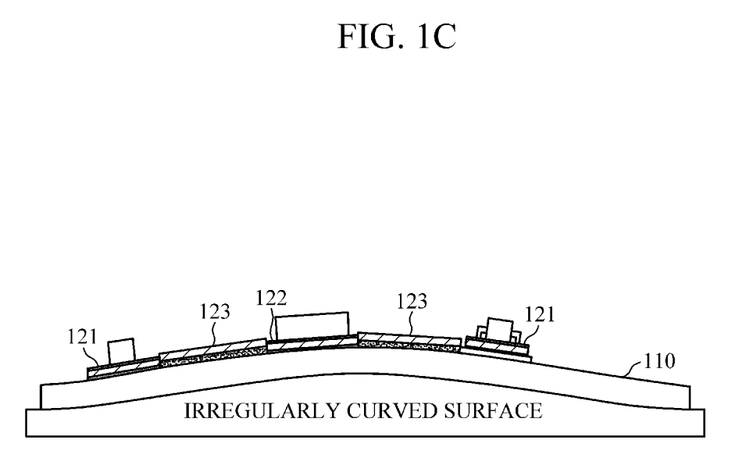

FIGS. 1A and 1B are a set of views illustrating a configuration of one embodiment of a customized stretchable wearable device according to the present invention. FIG. 1A is a view illustrating a state before the customized stretchable wearable device is assembled, FIG. 1B is a view illustrating a state in which the customized stretchable wearable device is being assembled, and FIG. 1C is a view illustrating a state after the customized stretchable wearable device is assembled.

As illustrated in FIGS. 1A and 1B, a customized stretchable wearable device 100 according to the present embodiment includes a stretchable wearable substrate 110 and a plurality of modularized flexible electronic blocks 120.

The stretchable wearable substrate 110 is worn on an irregularly curved surface. In this case, the term "irregular" shape does not refer to a "regular" shape but refers to a shape deformed due to movement thereof and the like.

For example, the irregularly curved surface may be skin of a wearing subject. In this case, the wearing subject may be a creature such as a person or an animal but is not limited thereto and may be a robot or an inanimate subject. Meanwhile, the stretchable wearable substrate 110 may be a transparent stretchable glove which is worn on the skin of the wearing subject but is not limited thereto.

For example, a material of the stretchable wearable substrate 110 may be polydimethylsiloxane (PDMS), epoxy resin polyurethane, ecoflex, elastomer, or the like but is not limited thereto.

The plurality of modularized flexible electronic blocks 120 are disposed on the stretchable wearable substrate 110 by being attached in a chemical or physical coupling manner, and the size, arrangement shape, or arrangement position thereof is adjusted to correspond to the characteristic of the irregularly curved surface on which the stretchable wearable substrate 110 is worn.

For example, the modularized flexible electronic blocks 120 may include circuit blocks 121 in which circuits including integrated circuit (IC) chips are modularized, a sensor block 122 in which a sensor is modularized, and stretchable electrode blocks 123 electrically connecting the above-described blocks.

For example, the circuit block 121 in which the circuits including the IC chips are modularized may be manufactured by chemically surface-treating a substrate film, printing electrodes on the chemically surface-treated film, and coupling the IC chips thereto.

In this case, plastic, poly ethylene naphthalate (PEN), or the like with a high Young's modulus may be used as the substrate film, and a chemical surface treatment may be performed thereon with 3-aminopropyl triethoxysilane (APTES), which is an aminosilane-based material, or the like.

For example, the sensor block 122 in which the sensor is modularized may be manufactured by chemically surface-treating a substrate film, printing electrodes on the chemically surface-treated film, and coupling the sensor thereto.

In this case, the plastic, PEN, or the like with a high Young's modulus may be used as the substrate film, and the chemical surface treatment may be performed thereon with APTES, which is an aminosilane-based material, or the like.

For example, the stretchable electrode blocks 123 for electrically connecting the circuit blocks 121 and the sensor block 122 may be manufactured by applying a polymer compound having stretchability onto a substrate coated with a stretchable electrode material and curing the polymer compound.

In this case, silver nano wires may be used as the stretchable electrode material, and PDMS in a liquid state may be used as the polymer compound having stretchability, wherein the PDMS has properties in which a length increases several times when pulled using an external force and is restored to the original length when the external force is removed.

Figure 2A:
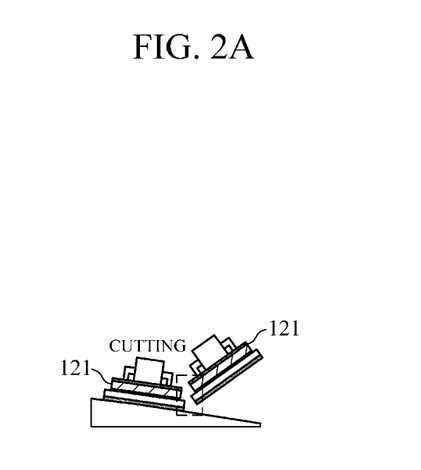
FIGS. 2A and 2B are a set of views illustrating that the size is adjusted by cutting a part of a modularized flexible electronic block.
Figure 2B:
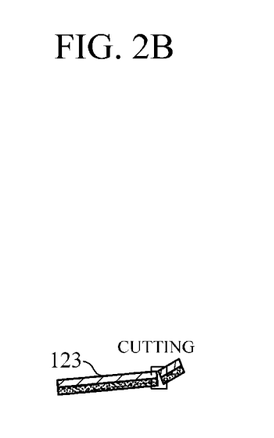

Meanwhile, the size or shape of each of the modularized flexible electronic blocks 120 may be adjusted by cutting a part thereof. For example, the size or shape of each of the modularized flexible electronic blocks 120 may be adjusted by forming the modularized flexible electronic blocks 120 to have a grid structure in which a plurality of flexible electronic block elements each having a predetermined shape and size are symmetrically disposed and cutting the flexible electronic block elements arranged to have the grid structure into a specific number.

FIGS. 2A and 2B are a set of views illustrating that the size is adjusted by cutting a part of the modularized flexible electronic block. FIG. 2A is a view illustrating that the size of the circuit block is adjusted by cutting a part of the circuit block element, and FIG. 2B is a view illustrating that the size of the stretchable electrode block is adjusted by cutting a part of the stretchable electrode block element.

Meanwhile, the modularized flexible electronic blocks 120 may be implemented to be chemically coupled to the stretchable wearable substrate 110 through covalent bonding. For example, in the case in which the material of the stretchable wearable substrate 110 is PDMS, methacrylate may be induced on a surface of the PDMS due to a sol-gel reaction, and an acrylic acid, which is a hydrophilic monomer, is covalently bonded to the methacrylate so that the modularized flexible electronic blocks 120 may be chemically coupled to the stretchable wearable substrate 110.

Unlike this, the modularized flexible electronic blocks 120 may also be implemented to be physically coupled to the stretchable wearable substrate 110 using a flexible bonding material. For example, a conductive adhesive, an anisotropic conductive film, a photo-curable polymer, a thermosetting polymer, or the like may be used as the flexible bonding material, and the modularized flexible electronic blocks 120 may be physically coupled to the stretchable wearable substrate 110 by melting the flexible bonding material on the stretchable wearable substrate 110, attaching the modularized flexible electronic blocks 120 to the stretchable wearable substrate 110, and curing the flexible bonding material.

In the case in which the modularized flexible electronic blocks 120 are chemically coupled to the stretchable wearable substrate 110 through covalent bonding, the modularized flexible electronic blocks 120 may be firmly coupled to the stretchable wearable substrate 110, but reassembly of the modularized flexible electronic blocks 120 is impossible.

Figure 3A:
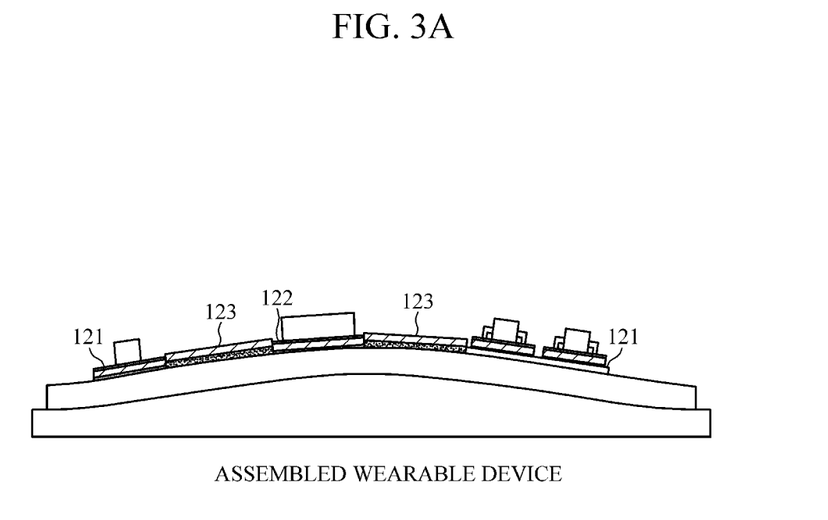
FIGS. 3A, 3B and 3C are a set of views illustrating a process of reassembling the modularized flexible electronic blocks.
Figure 3B:
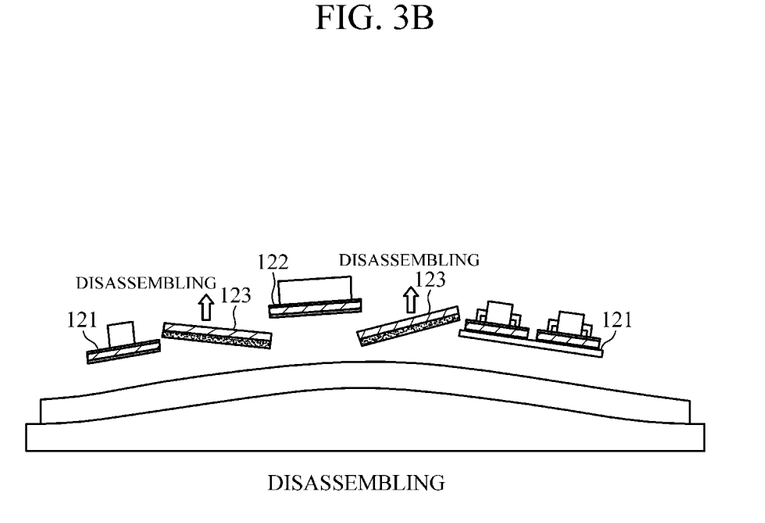
Figure 3C:
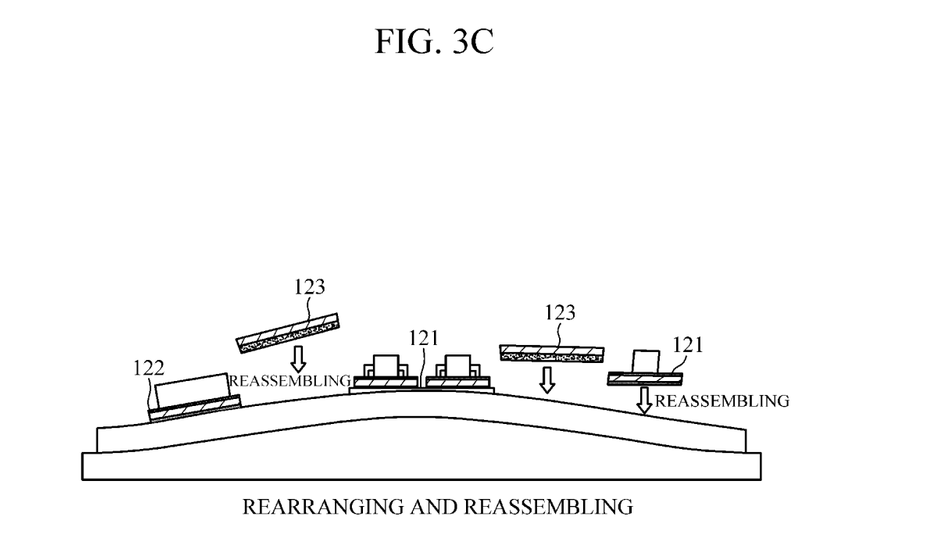

However, in the case in which the modularized flexible electronic blocks 120 are physically coupled to the stretchable wearable substrate 110 using the flexible bonding material, the modularized flexible electronic blocks 120 are not firmly attached to the stretchable wearable substrate 110 when compared to the case in which the modularized flexible electronic blocks 120 are chemically coupled to the stretchable wearable substrate 110, but as illustrated in FIGS. 3A, 3B and 3C, the modularized flexible electronic blocks 120 may be separated from the stretchable wearable substrate 110, the size, shape, and arrangement thereof may be changed, and the modularized flexible electronic blocks 120 may be reassembled. FIGS. 3A, 3B and 3C are a set of views illustrating a process of reassembling the modularized flexible electronic blocks.

By implementing like this, in the present invention, the customized stretchable wearable device corresponding to the body characteristics of the wearing subject wearing the wearable device may be manufactured by cutting the modularized flexible electronic blocks 120 to correspond to the body characteristics (characteristic of the irregularly curved surface) of the wearing subject wearing the wearable device to adjust the sizes, arrangement shapes, or arrangement positions of the modularized flexible electronic blocks 120 to correspond to the characteristics of the irregularly curved surface, and coupling the modularized flexible electronic blocks 120 to stretchable wearable substrate 110. Accordingly, the present invention may provide the customized stretchable wearable device of which wearing and operating sensations are good and an exterior is beautiful.

According to an additional aspect of the present invention, the customized stretchable wearable device 100 may further include buffer layers 130. The buffer layers 130 are chemically or physically coupled between the stretchable wearable substrate 110 and the modularized flexible electronic blocks 120 to prevent delamination of the modularized flexible electronic blocks 120 coupled to the stretchable wearable substrate 110.

Since the stretchable wearable substrate 110 should be easily bent and have stretchability to correspond to the body characteristics (characteristic of the irregularly curved surface) of the wearing subject, a Young's modulus of the stretchable wearable substrate 110 is relatively lower than a Young's modulus of each of the modularized flexible electronic blocks 120.

However, the Young's modulus of each of the modularized flexible electronic blocks 120 is relatively higher than the Young's modulus of the stretchable wearable substrate 110 to improve stability of the circuits, the sensor, or the like modularized in the flexible electronic blocks 120.

Since a Young's modulus denotes an elastic modulus which denotes an extent to which an object stretches and is deformed when stretched from both sides thereof, in a case in which the body characteristics (characteristic of the irregularly curved surface) of the wearing subject wearing the customized stretchable wearable device 100 are changed, the modularized flexible electronic blocks 120 coupled to the stretchable wearable substrate 110 may be delaminated due to a difference in Young's modulus between the stretchable wearable substrate 110 and modularized flexible electronic blocks 120 and a difference in stretching extent.

Accordingly, in order to prevent the delamination of the modularized flexible electronic blocks 120 coupled to the stretchable wearable substrate 110, the buffer layers 130 chemically or physically coupled between the stretchable wearable substrate 110 and the modularized flexible electronic blocks 120 may be provided.

In this case, a Young's modulus of the buffer layers 130 chemically or physically coupled between the stretchable wearable substrate 110 and the modularized flexible electronic blocks 120 may have a value between the Young's modulus of the stretchable wearable substrate 110 and the Young's modulus of the modularized flexible electronic blocks 120.

By coupling the buffer layers 130 having the Young's modulus between the Young's modulus of the stretchable wearable substrate 110 and the Young's modulus of the modularized flexible electronic blocks 120 between the stretchable wearable substrate 110 and the modularized flexible electronic blocks 120 having different Young's moduli, the Young's moduli may be buffered to prevent the delamination of the modularized flexible electronic blocks 120 coupled to the stretchable wearable substrate 110.

Figure 4:
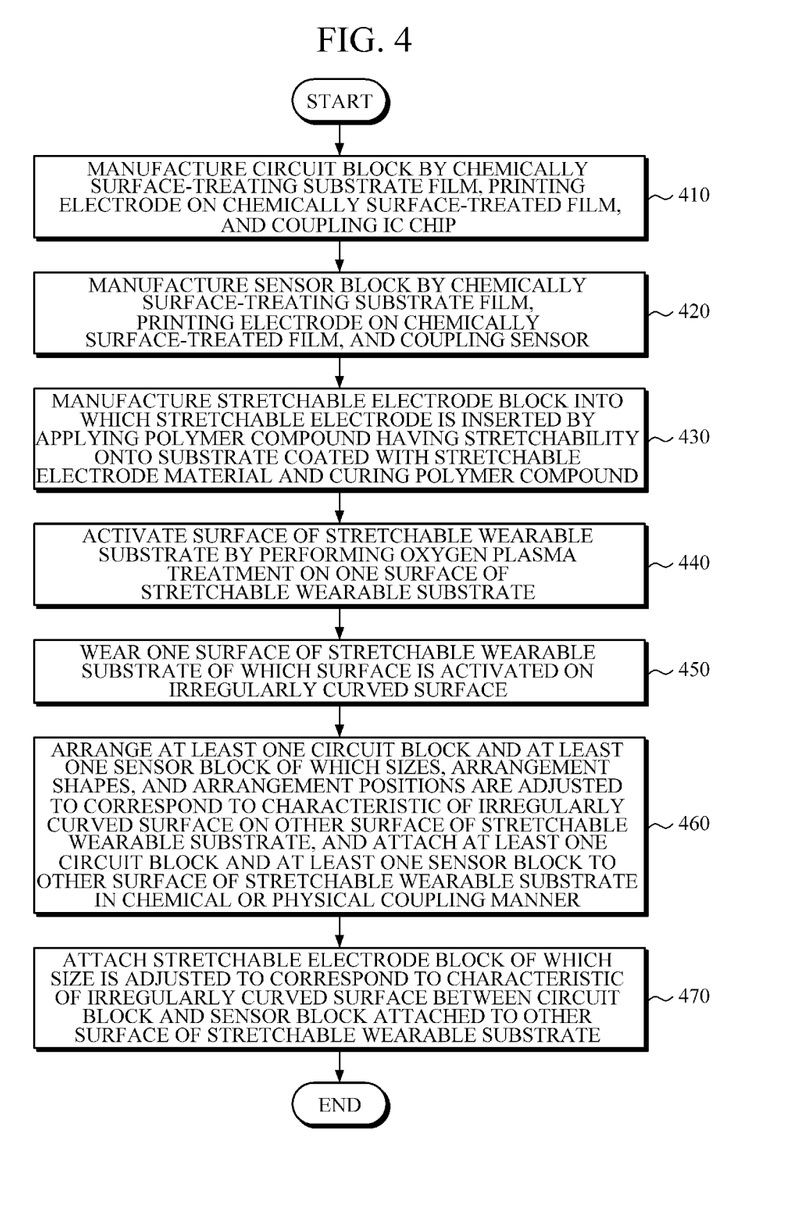
FIG. 4 is a flowchart illustrating one embodiment of a method of manufacturing the customized stretchable wearable device according to the present invention.

A manufacturing process of the customized stretchable wearable device according to the present invention as described above will be described with reference to FIG. 4. FIG. 4 is a flowchart illustrating one embodiment of a method of manufacturing the customized stretchable wearable device according to the present invention.

First, in a circuit block manufacturing operation (410), circuit blocks are manufactured by chemically surface-treating a substrate film, printing electrodes on the chemically surface-treated film, and coupling IC chips.

For example, plastic or PEN with a high Young's modulus may be used as the substrate film, and the chemical surface treatment may be performed using APTES which is an aminosilane-based material and the like.

Next, in a sensor block manufacturing operation (420), sensor blocks are manufactured by chemically surface-treating a substrate film, printing electrodes on the chemically surface-treated firm, and coupling sensors.

For example, plastic or PEN with a Young's modulus may be used as the substrate film, and the chemical surface treatment may be performed using APTES, which is an aminosilane-based material, or the like.

Next, in a stretchable electrode block manufacturing operation (430), stretchable electrode blocks into which stretchable electrodes are inserted are manufactured by applying a polymer compound having stretchability onto a substrate coated with a stretchable electrode material and curing the polymer compound.

For example, silver nano wires may be used as the stretchable electrode material, and PDMS in a liquid state may be used as the polymer compound having stretchability, wherein the PDMS has properties in which a length increases several times when pulled using an external force and is restored to the original length when the external force is removed.

Next, in a substrate surface activating operation (440), one surface of the stretchable wearable substrate is treated with oxygen plasma to activate the surface. Next, in a substrate wearing operation (450), the surface-activated surface of the stretchable wearable substrate is worn on an irregularly curved surface. In this case, the term "irregular" shape does not refer to a "regular" shape and refers to a shape deformed due to movement thereof and the like.

For example, the irregularly curved surface may be skin of a wearing subject. In this case, the wearing subject may be a creature such as a person or an animal but is not limited thereto and may be a robot or an inanimate subject. Meanwhile, the stretchable wearable substrate may be a transparent stretchable glove which is worn on the skin of the wearing subject but is not limited thereto.

For example, a material of the stretchable wearable substrate may be PDMS, epoxy resin polyurethane, ecoflex, elastomer, or the like but is not limited thereto.

Next, in a circuit block and sensor block attaching operation (460), at least one circuit block and at least one sensor block of which the size, arrangement shape, and arrangement position are adjusted to correspond to the characteristic of the irregularly curved surface are disposed on the other surface of the stretchable wearable substrate and attached thereto in a chemical or physical coupling manner.

In this case, the size or shape may be adjusted by cutting parts of the circuit block and the sensor block. For example, the size or shape of the circuit block and the size or shape of the sensor block may be adjusted by forming the circuit block and the sensor block to have grid structures in which a plurality of circuit block elements each having a predetermined shape and size and a plurality of sensor block elements, each having a predetermined shape and size, are symmetrically disposed and cutting the circuit block elements and the sensor block elements arranged to have the grid structures into specific numbers.

For example, in the case in which the material of the stretchable wearable substrate is PDMS, the circuit block and the sensor block may be chemically coupled to the stretchable wearable substrate by inducing methacrylate on a surface of the PDMS due to a sol-gel reaction, and covalently bonding an acrylic acid, which is a hydrophilic monomer, to the methacrylate.

Unlike this, a conductive adhesive, an anisotropic conductive film, a photo-curable polymer, a thermosetting polymer, or the like may be used as the flexible bonding material, and the circuit block and the sensor block may be physically coupled to a stretchable wearable substrate 110 by melting the flexible bonding material on the stretchable wearable substrate, attaching the circuit block and the sensor block to the stretchable wearable substrate, and curing the flexible bonding material.

In the case in which the circuit block and the sensor block are chemically coupled to the stretchable wearable substrate through covalent bonding, the circuit block and the sensor block may be firmly coupled to the stretchable wearable substrate, but reassembly of the circuit block and the sensor block is impossible.

However, in the case in which the circuit block and the sensor block are physically coupled to the stretchable wearable substrate using the flexible bonding material, the circuit block and the sensor block are not firmly attached to the stretchable wearable substrate when compared to the case in which the circuit block and the sensor block are chemically coupled to the stretchable wearable substrate, but the circuit block and the sensor block may be separated from the stretchable wearable substrate, the sizes, shapes, and arrangements thereof may be changed, and the circuit block and the sensor block may be reassembled.

Next, in a stretchable electrode block attaching operation (470), the stretchable electrode block, of which the size is adjusted to correspond to the characteristic of the irregularly curved surface, is attached between circuit block and the sensor block attached to the other surface of the stretchable wearable substrate. In this case, the size or shape may be adjusted by cutting a part of the stretchable electrode block.

For example, the size or shape of the stretchable electrode block may be adjusted by forming the flexible electronic block to have a grid structure in which the stretchable electrode block elements each having a predetermined shape and size are symmetrically arranged and cutting the flexible electronic block elements arranged to have the grid structure into a specific number. Meanwhile, the stretchable electrode block may be attached to the stretchable wearable substrate in a chemical or physical coupling manner like the circuit block and the sensor block.

By implementing like this, in the present invention, the customized stretchable wearable device corresponding to body characteristics of a wearing subject wearing the wearable device may be manufactured by cutting the modularized flexible electronic blocks 120 to correspond to the body characteristics (characteristic of the irregularly curved surface) of the wearing subject wearing the wearable device to adjust the sizes, arrangement shapes, or arrangement positions of the modularized flexible electronic blocks 120 to correspond to the characteristics of the irregularly curved surface, and coupling the modularized flexible electronic blocks 120 to the stretchable wearable substrate 110. Accordingly, the present invention may provide the customized stretchable wearable device of which wearing and operating sensations are good and an exterior is beautiful.

Meanwhile, according to an additional aspect of the present invention, in the circuit block manufacturing operation (410), the sensor block manufacturing operation (420), or the stretchable electrode block manufacturing operation (430), a buffer layer for preventing the delamination of the circuit block, the sensor block, or the stretchable electrode block which is attached to the stretchable wearable substrate may be formed on the attachment surface of the substrate of the circuit block, the sensor block, or the stretchable electrode block.

The buffer layer is chemically or physically coupled between the stretchable wearable substrate and the circuit block, the sensor block, and the stretchable electrode block which is the modularized flexible electronic block coupled to the stretchable wearable substrate to prevent the delamination of the circuit block, the sensor block, or the stretchable electrode block.

Since the stretchable wearable substrate should be easily bent and have stretchability to correspond to the body characteristics (characteristic of the irregularly curved surface) of the wearing subject, a Young's modulus of the stretchable wearable substrate is relatively lower than that of the circuit block, the sensor block, or the stretchable electrode block.

However, the Young's modulus of the circuit block, the sensor block, or the stretchable electrode block which is the modularized flexible electronic block is relatively higher than the Young's modulus of the stretchable wearable substrate to improve stability of the circuit, or the sensor, or the electrode which is modularized.

Since the Young's modulus denotes an elastic modulus which denotes an extent to which an object extends and is deformed when stretched from both sides thereof, in a case in which the body characteristics (characteristic of the irregularly curved surface) of the wearing subject wearing the customized stretchable wearable device are changed, the circuit block, the sensor block, or the stretchable electrode block coupled to the stretchable wearable substrate may be delaminated due to a difference in Young's modulus between the stretchable wearable substrate and the circuit block, the sensor block, or the stretchable electrode block and a difference in stretching extent.

Accordingly, in order to prevent the delamination of the circuit block, the sensor block, or the stretchable electrode block coupled to the stretchable wearable substrate, the buffer layer chemically or physically coupled between the stretchable wearable substrate and the circuit block, the sensor block, or the stretchable electrode block is provided.

In this case, the Young's modulus of the buffer layer chemically or physically coupled between the stretchable wearable substrate and the circuit block, the sensor block, or the stretchable electrode block may have a value between the Young's modulus of the stretchable wearable substrate and the Young's modulus of the circuit block, the sensor block, or the stretchable electrode block.

By coupling the buffer layer having the Young's modulus between the Young's modulus of the stretchable wearable substrate and the Young's modulus of the circuit block, the sensor block, or the stretchable electrode block between the stretchable wearable substrate and the circuit block, the sensor block, or the stretchable electrode block having different Young's moduli, the Young's moduli are buffered and the delamination of the circuit block, the sensor block, or the stretchable electrode block coupled to the stretchable wearable substrate may be prevented.

Meanwhile, the order of the circuit block manufacturing operation (410), the sensor block manufacturing operation (420), and the stretchable electrode block manufacturing operation (430) may be interchanged.

Figure 5:
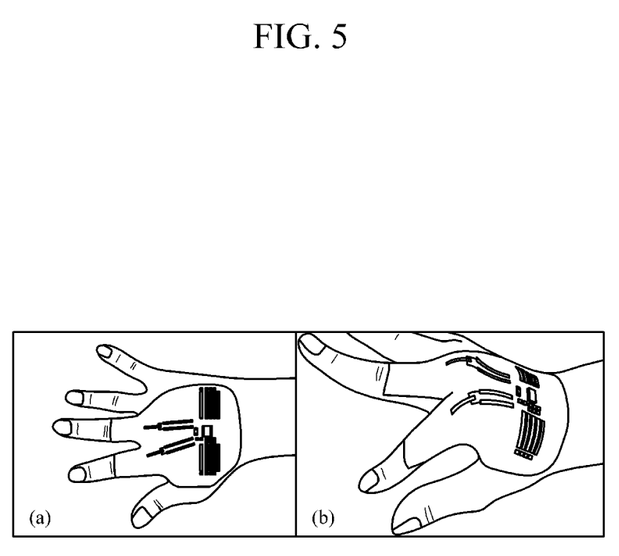
FIG. 5 is a set of views illustrating the customized stretchable wearable device manufactured in a transparent stretchable glove shape according to the present invention.

FIG. 5 is a set of views illustrating the customized stretchable wearable device manufactured in the transparent stretchable glove shape according to the present invention. Referring to FIG. 5, it is shown that the circuit block, the sensor block, and the stretchable electrode block for connecting the circuit block and the sensor block which are a plurality of modularized flexible electronic blocks of which sizes, arrangement shapes, and arrangement positions are adjusted to correspond to characteristics such as a size and a shape of the hand of a wearer are disposed on the stretchable wearable substrate having a shape of the transparent stretchable glove which is worn on the hand of the wearer having an irregularly curved surface.

As described above, since the present invention may provide the customized stretchable wearable device corresponding to the body characteristics of the wearing subject wearing the wearable device, the wearing and operating sensations are good and the exterior is beautiful.

The various embodiments disclosed in this specification and drawings are only specific examples to aid in understanding of the invention and are not intended to limit various embodiments of the present invention.

Accordingly, the scope of various embodiments of the present invention should not be limited by the above-described embodiments, and all changes or modifications derived from the technical ideas of various embodiments of the present invention should be construed as being included in the scope of various embodiments of the present invention.

INDUSTRIAL APPLICABILITY

The present invention may be industrially used in the wearable device related technical field and in the applied technology field thereof.

The invention claimed is:

1. A customized stretchable wearable device comprising:
   a stretchable wearable substrate which is worn on an irregularly curved surface; and
   a plurality of modularized flexible electronic blocks which are attached to the stretchable wearable substrate in a chemical or physical coupling manner, and of which sizes, arrangement shapes, and arrangement positions are adjusted to correspond to a characteristic of the irregularly curved surface on which the stretchable wearable substrate is worn,
   wherein a size or shape of each of the modularized flexible electronic blocks is adjustable by forming the modularized flexible electronic blocks to have a grid structure in which a plurality of flexible electronic block elements each having a predetermined shape and size are symmetrically disposed and cutting the flexible electronic block elements arranged to have the grid structure into a specific number,
   wherein each of the modularized flexible electronic blocks is chemically coupled to the stretchable wearable substrate through covalent bonding.

2. The customized stretchable wearable device of claim 1, further comprising a buffer layer chemically or physically coupled between the stretchable wearable substrate and each of the modularized flexible electronic blocks so as to prevent delamination of the modularized flexible electronic blocks coupled to the stretchable wearable substrate.

3. The customized stretchable wearable device of claim 1, wherein the irregularly curved surface is skin of a wearing subject.

4. The customized stretchable wearable device of claim 3, wherein the stretchable wearable substrate includes a transparent stretchable glove which is worn on skin of a wearing subject.

5. The customized stretchable wearable device of claim 1, wherein a material of the stretchable wearable substrate is polydimethylsiloxane (PDMS), and wherein methacrylate is induced on a surface of the PDMS due to a sol-gel reaction.

6. The customized stretchable wearable device of claim 5, wherein an acrylic acid, which is a hydrophilic monomer, is covalently bonded to the methacrylate so that the modularized flexible electronic blocks are chemically coupled to the stretchable wearable substrate.

7. A method of manufacturing a customized stretchable wearable device, comprising:
  a circuit block manufacturing operation of manufacturing a circuit block by chemically surface-treating a substrate film, printing an electrode on the chemically surface-treated film, and coupling an integrated circuit (IC) chip;
  a sensor block manufacturing operation of manufacturing a sensor block by chemically surface-treating a substrate film, printing an electrode on the chemically surface-treated film, and coupling a sensor;
  a stretchable electrode block manufacturing operation of manufacturing a stretchable electrode block into which a stretchable electrode is inserted by applying and curing a polymer compound having stretchability onto a substrate coated with a stretchable electrode material;
  a substrate surface activating operation of activating a surface of a stretchable wearable substrate by performing an oxygen plasma treatment on one surface of the stretchable wearable substrate;
  a substrate wearing operation of wearing the one surface, on which the surface is activated, of the stretchable wearable substrate on an irregularly curved surface;
  a circuit block and sensor block attaching operation of arranging at least one circuit block and at least one sensor block each of which a size, an arrangement shape, and an arrangement position are adjusted to correspond to a characteristic of the irregularly curved surface on the other surface of the stretchable wearable substrate and attaching the at least one circuit block and the at least one sensor block to the stretchable wearable substrate in a chemical or physical coupling manner; and
  a stretchable electrode block attaching operation of attaching the stretchable electrode block of which a size is adjusted to correspond to the characteristic of the irregularly curved surface between the circuit block and the sensor block which are attached to the other surface of the stretchable wearable substrate,
  wherein the at least one circuit block and the at least one sensor block are chemically coupled to the stretchable wearable substrate through covalent bonding.

8. The method of claim 7, wherein, in the circuit block manufacturing operation, the sensor block manufacturing operation, or the stretchable electrode block manufacturing operation, a buffer layer for preventing delamination of the circuit block, the sensor block, or the stretchable electrode block attached to the stretchable wearable substrate is formed on an attachment surface of the substrate of the circuit block, the sensor block, or the stretchable electrode block.

* * * * *